(12) United States Patent
Farley

(10) Patent No.: US 6,297,510 B1
(45) Date of Patent: Oct. 2, 2001

(54) ION IMPLANT DOSE CONTROL

(75) Inventor: Marvin Farley, Ipswich, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/293,942

(22) Filed: Apr. 19, 1999

(51) Int. Cl.⁷ .................. H01J 37/304; H01J 37/317
(52) U.S. Cl. ............................................ 250/492.21
(58) Field of Search ...................... 250/492.21; 438/5

(56) References Cited

U.S. PATENT DOCUMENTS

| | | | |
|---|---|---|---|
| 4,234,797 | 11/1980 | Ryding | 250/492.21 |
| 4,539,217 | 9/1985 | Farley | 427/10 |
| 4,587,433 | 5/1986 | Farley | 250/492.2 |
| 4,680,474 | 7/1987 | Turner et al. | 250/492.21 |
| 5,229,615 | 7/1993 | Brune et al. | 250/492.2 |
| 5,672,882 * | 9/1997 | Day et al. | 250/492.21 |
| 5,760,409 | 6/1998 | Chen et al. | 250/492.21 |

FOREIGN PATENT DOCUMENTS

0398270 A2  11/1990  (EP).
WO 9913488  3/1999  (WO).

OTHER PUBLICATIONS

"Automatic Determination of Pressure Compensation Factors Without Requiring Wafer Implants", Mike Halling, et al., Ion Implantation Technology Proceedings of the International Conference on Ion Implantation Technology, pp. 312–314, Jun. 22, 1998, vol. 1.

* cited by examiner

Primary Examiner—Jack Berman
(74) Attorney, Agent, or Firm—Boult Wade Tennant

(57) ABSTRACT

The true beam current corrected for neutrals in the beam impinging on the wafer during processing, is calculated by taking repeated measurements of the beam current during periods when the beam is clear of the wafer during a process. During such periods of multiple beam current measurements, the residual gas pressure declines in accordance with a pump down constant which is also determined. A quadratic expression relating measured beam current and time can then be solved for a factor giving a value for the corrected beam current. A corrected beam current is used to control the dosimetry of the apparatus to ensure the correct dose is uniformly applied to the surface of a wafer.

17 Claims, 2 Drawing Sheets

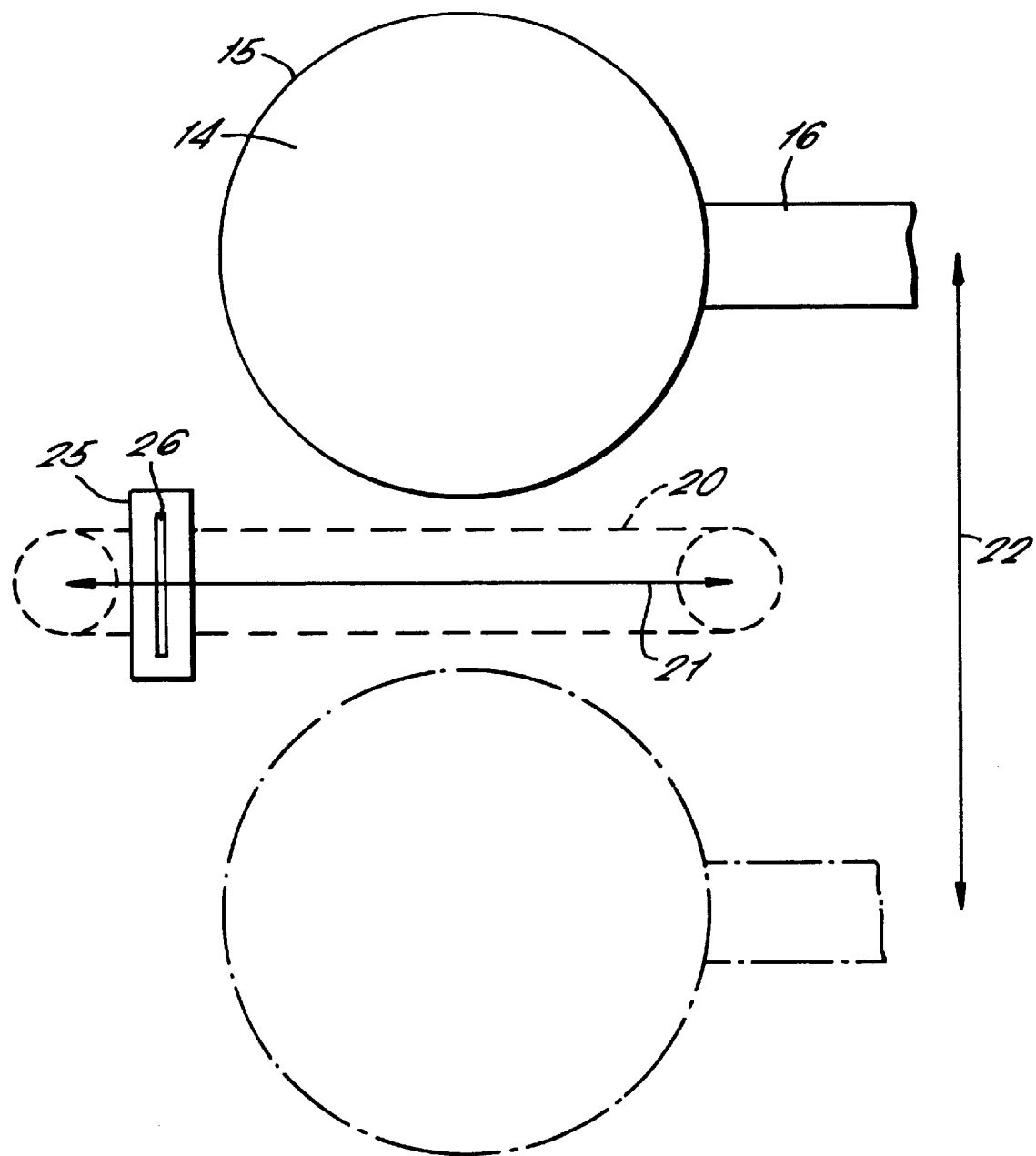

ION IMPLANT DOSE CONTROL

FIELD OF THE INVENTION

This invention is concerned with improvements in or relating to the control of ion dosing in the manufacture of semiconductor wafers.

BACKGROUND OF THE INVENTION

Ion implanters are commonly used in the manufacture of semiconductor and metallic products for implanting ions into semiconductor or metallic substrates to change the conductivity of the material in such substrates or in predefined regions thereof. Ion implanters generally comprise an ion beam generator for generating a beam of ions, a mass analyser for selecting a particular species of ions in the ion beam and means to direct the ion beam through a vacuum chamber onto a target substrate supported on a substrate holder. The ion beam cross-sectional area depends on such factors as the beam line configuration, the degree of focusing applied to the ion beam, the gas pressure along the beam line, the energy of the ion beam and the mass of the ions. Most frequently, the ion beam cross-sectional area at the target substrate is less than the surface area of the substrate which necessitates traversal of the beam over the substrate in a one or two-dimensional scan so that the beam covers the whole surface thereof. The three two-dimensional scanning techniques commonly employed in ion implantation are (i) electrostatic and/or magnetic deflection of the ion beam relative to a static substrate, (ii) mechanical scanning of the target substrate in two dimensions relative to a static ion beam and (iii) a hybrid technique involving magnetic or electrostatic deflection of the ion beam in one direction and mechanical scanning of the target substrate in another generally orthogonal direction.

An important objective in the fabrication of semiconductor wafers is to ensure that for any selected species of ions, the wafers are implanted with the correct ion dose and that the dose is uniform throughout and across the wafer or part of the wafer targeted to receive the implanted ions. At present, the semiconductor industry frequently demands a dose uniformity of about 1% or better. Failure to achieve such standards is both time consuming and very costly due to the significantly high cost of the wafers themselves.

Dose is monitored by measuring beam current during an implant process using an ion beam current detector (usually a Faraday cup) positioned 'behind' the plane of the wafer so that, as the beam and the wafer effect movement one relative to the other, the beam can fall on the Faraday cup. Where implantation of multiple wafers is concerned, this may be achieved by positioning the cup behind the movable (usually rotatably) wafer holder with one or more gaps/slits in the holder through which the beam can pass to the cup which is aligned with the general path of the beam. Where single wafer implantation occurs, the Faraday cup will normally be placed to one side of the wafer so that the beam is moved across the cup during each single traverse or sweep of the beam across the wafer.

Existing beam current detectors will not detect any ions which have been neutralised prior to being implanted in the wafer, and so will normally understate the true rate of delivery of desired species, including both ions and neutrals, in the beam. Beam ions are generally neutralised by collisions with residual gas molecules in the chamber and it is known that the proportion of ions which become neutralised increases with increasing residual gas pressure. Collisions may also result in the state of charge of beam ions being increased, e.g. from singly to doubly charged or reduced, e.g. from doubly to singly charged, and both these effects can contribute to beam current measuring errors.

It has been recognised that there is a need to compensate for these effects in measuring and calculating the true beam current, i.e. the current assuming no neutrals or changes of charge state. This true or corrected beam current would be a proper measure of the rate of delivery in the beam of particles of the species to be implanted. With accurate monitoring of corrected beam current the implant process can be adjusted to provide that compensation.

In U.S. Pat. No. 4,234,797 there is disclosed apparatus for controlling the treatment of a workpiece by a beam emanating from a source, in which there is translational relative movement in two orthogonal directions between the beam and the workpiece support element, and control of velocity in one (control) direction occurs in response to a detector, mounted behind the support, which periodically samples the beam through a moving slot in the support element. This slot extends over the range of movement in the control direction. An ion implanter is shown in which the support element is a constantly spinning disk the axis of which is translated in the control direction. Another ion implanter is shown in which the support element is a moving belt. A simple control circuit, useful for both embodiments, achieves a uniform ion dosage upon semiconductor substrates at a high production rate despite variations in beam intensity. The detector is not affected by a shower of electrons upon the support that neutralizes charge on the workpieces.

In each of U.S. Pat. Nos. 4,539,217, 4,587,433 and 5,760,409, both method and apparatus are disclosed for measuring and compensating for neutral ions in an ion beam in the dose control system of an ion implanter. The gas pressure in the implantation volume is measured, and the pressure signal is used to calculate an effective or corrected beam current value in accordance with a predetermined relationship between the gas pressure, the apparent or measured beam current and a term which is commonly referred to as the Pressure Compensation factor K. The resulting effective beam current value is then supplied to the dose control system.

In U.S. Pat. No. 4,539,217 and U.S. Pat. No. 4,587,433, a dynamic mode of operation is described in which values for K are determined during an ion implantation process, by comparing simultaneous measurements of measured ionic current and pressure, with corresponding simultaneous measurements taken previously during the process. In these patents, K is taken to be defined by the relationship $$I_o = I_m(1+KP),$$

where $I_o$ is the corrected beam current $I_m$ is the measured beam current
and P is the residual pressure.

This assumed linear relationship between corrected beam current and residual gas pressure provides limited accuracy, especially at higher beam energies.

In U.S. Pat. No. 5,760,409, K is defined by the relationship $$I_m = I_o[1+(\gamma-1)(1-e^{-KP})],$$

which reduces to $I_m = I_o \exp(-KP)$ if $\gamma = 0$.

The additional parameter $\gamma$ can be interpreted as the ratio of final steady charge state to the initial injected charge state. Both K and $\gamma$ are determined empirically prior to performing production implant runs, and the values stored for each particular process recipe to be optimised.

The need to perform repeated test implants in order to assemble values for K and γ for each implant recipe is time consuming and laborious. Also an unexpected change in a parameter during an implant process could result in the computations, using empirically determined K and γ values to calcultate a corrected beam current, becoming inaccurate, resulting in dosimetry errors.

SUMMARY OF THE INVENTION

An object of the present invention is to estimate and measure the true beam current $I_o$ reliably and accurately without the need to compile databases of the values of experimentally determined constants, such as K, as in the prior art, and thereby to produce a more efficient solution to the implantation of ions in wafers with compensation for any irregularities in the ion dosage.

The present invention provides an ion implanter having a vacuum chamber, a substrate holder in the vacuum chamber for supporting a target substrate, an ion beam generator for generating a beam of ions of a species to be implanted in the target substrate, a scanning apparatus for effecting a relative scanning movement of the ion beam across the target substrate, a vacuum pump for operating during implantation to pump residual gas from the vacuum chamber, a residual gas pressure detector producing a pressure signal indicative of changes in the residual gas pressure in the chamber, the scanning apparatus being arranged to produce during an implant repeated scans of the beam over the target substrate separated by periods when the beam does not impinge on the target substrate, whereby residual gas pressure in said chamber rises during each of said scans due to outgassing from the target substrate and falls during said separating periods due to pumping by said vacuum pump, an ion current detector providing multiple time spaced measurements of the ionic current in the ion beam at the target substrate during each of a plurality of the said separating periods, and a processor receiving said multiple measurements and data derived from said pressure signal indicating the changes in the residual gas pressure, and calculating therefrom a corrected value for total beam current representing the rate of delivery in the beam of particles of the species to be implanted.

The processor is preferably arranged to calculate said corrected value by extrapolating changes in the measured ionic current during a said separating period to calculate a value for said current at infinite time. During the above mentioned separating periods, it can be assumed that residual gas pressure $P_t$ is related to time t by the expression $$P_t = P_o[\exp(-t/\tau)] \quad (1)$$

Where $P_o$ is the pressure at t=0,
and τ is the pump down time constant.

The processor may be arranged to determine from said pressure signal a value for τ, and to use said value of τ to estimate the shape of a curve fitting said multiple time-spaced measurements of ionic current. Essentially, the invention provides multiple time related ion beam current measurements during a so-called separating period in an implant process, when the residual gas pressure is changing in a predictable way determined by a pump down time constant. By determining the value of the pump down time constant, the multiple time related beam current values can be fitted to a curve which can be used to predict accurately the value of beam current when t→∞, which is when residual gas pressure should tend to zero and measured beam current should be equal to the actual rate of delivery of desired species in the beam.

In the present invention, measurement of pressure is only used to derive the chamber pumpdown constant τ and not the absolute pressure, and therefore the accuracy of the pressure measurement is not important and the need to calculate and store values of the pressure compensation factor K is eliminated.

This invention provides a unique solution to the problem of measuring and controlling implant dose while implanting energetic ions into wafers, and in particular into photoresist-coated wafers. The implanter and method disclosed herein improve the state of the art for accurate beam current measurement using a Faraday cup and measurement means, such as an electrometer, when background gas alters the charge state of the energetic ions travelling through the gas. The technique is applicable to batch (multiple wafer) and single wafer implants. For both types of implanters, the method of measurement and control makes use of the fact that the wafer is scanned through the ion beam and measurements of beam current is taken when the wafer is out of the beam path. During this time, outgassing from the resist coating in the wafer ceases so that the source of background gas is essentially removed and the implant chamber vacuum recovers in a relatively predictable way. It is not necessary for the pressure to recover significantly for an accurate prediction of the true corrected beam current to be made.

As described in the prior art U.S. Pat. No. 5,760,409, the measured beam current can be expressed by the equation $$I_m = I_o (\exp{-KP_t}) \quad (2)$$

where $I_o$ is the true corrected beam current (assuming zero residual pressure), K is the pressure compensation factor and $P_t$ is the pressure (which may be a function of time). Equation 1 can be restated as $$\ln P_t = \ln P_o - t/\tau \cdot (1a)$$

Measurement of the value of the pumpdown constant τ can be achieved from measurements of the pressure in the vacuum chamber of the implanter during the initial pumpdown phase of the operation of the implanter apparatus. As few as two such measurements only need to be made to establish the slope of the line represented by equation (1a), though, to be more accurate, it is preferred to make twenty or more measurements.

Now, substituting for $P_t$ from equation (1) into equation (2) leads to the following equation for beam current measured during a vacuum recovery period (or so-called separating period);

$$I_m = I_o[\exp{-KP_o(\exp{-t/\tau})}] \quad (3)$$

Equation (3), when expressed in logarithmic form, is;

$$\ln(I_m) = \ln(I_o) - KP_o(\exp{-t/\tau}) \quad (4)$$

If beam current measurements $I_i$ are taken at times $t_i$, these can be related in a general expression of the form $$\ln I_i = b_0 + b_1[\exp{-t_i/\tau}] \quad (5)$$

Where $b_0 = \ln(I_o)$ and $b_1 = -KP_o$

Using at least two sets of values obtained by measurement for $I_i$ and $t_i$, this expression can be solved for $b_0$ and $b_1$ directly, provided that the value of $\tau$ is known or has been measured.

Thus the true beam current $I_o$ can then be established, without the need to establish the value of K.

In this example, the true beam current is estimated from samples of I, t, and a knowledge of $\tau$. The absolute measurement of pressure is not required.

The above expression (5) would indicate a linear relationship between $\ln I_i$ and $\exp(-t_i/\tau)$. In practice, plots of these values show a deviation from a straight line. This may be predicted if not only charge exchange events resulting in neutralisation of singly charged ions, but also charge stripping events, which cause singly charged ions in the beam to become doubly charged, are taken into account.

Accordingly, a quadratic expression can provide a better fit to measured values of $I_i$ and $t_i$, thus:

$$\ln I_i = b_o + b_1[\exp(-t_i/\tau)] + b_2[\exp(-t_i/\tau)]^2 \quad (6)$$

The value of $b_0$ can be derived by taking enough measurements (at least three) of $I_i$ at times $t_i$ to solve equation (6) for $b_0$.

Again the absolute pressure is not necessary for the above correction algorithm to function. The only measurements that are necessary are of $I_i$ and $t_i$, and knowledge of $\tau$. The pumpdown constant can be measured at the commencement of implantation but we prefer to evaluate $\tau$ repeatedly during an implant during the so called separating periods.

BRIEF DESCRIPTION OF THE DRAWINGS

FIG. 2 is an enlarged view of part of the implanter of FIG. 1 illustrating the scanning arrangement.

Figure 1:
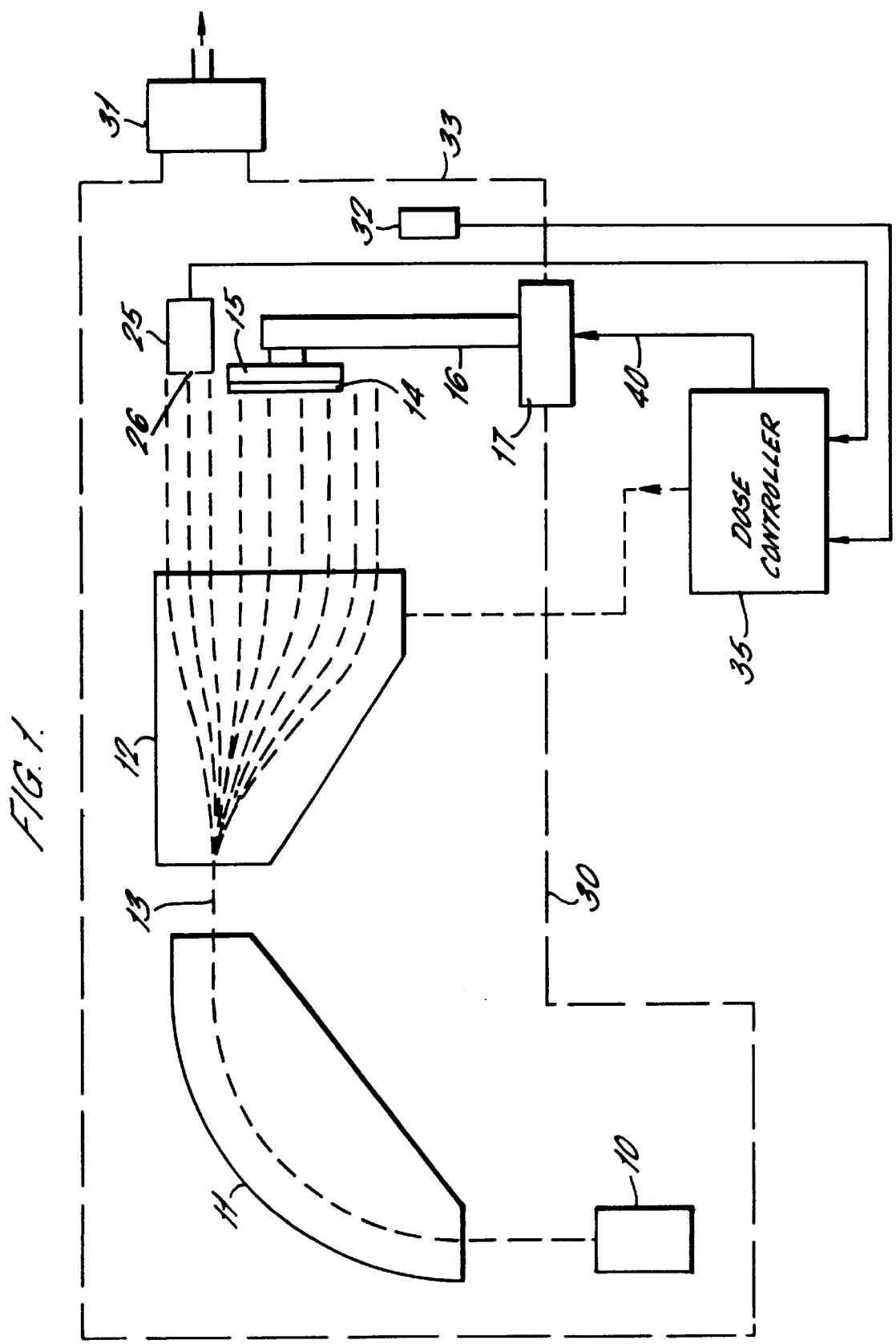
FIG. 1 is a schematic diagram of an implanter which may embody the present invention.

The implanter of FIG. 1 is a single wafer machine for processing one silicon wafer at a time. The present invention can readily be illustrated with reference to such a single wafer implant machine, but it should be understood that the invention may also be embodied in batch implanters of the type in which a batch of wafers mounted on a spinning wheel is processed simultaneously.

In the single wafer machine of FIG. 1, a beam of ions of a desired species is extracted from an ion source 10 and supplied through a mass selection magnet 11 to a beam scanning device 12. The mass selection magnet 11 ensures that only ions of the desired species are supplied in the beam 13 leaving the mass selector. The beam scanning device 12 causes the ion beam to be rapidly scanned to and fro in a direction normal to the beam direction, in the plane of the paper in the example of FIG. 1. In this way, the beam of ions is scanned repeatedly across a wafer 14 mounted on a carrier or chuck 15 which holds the wafer in a plane transverse to the beam direction.

It will be understood by those skilled in the art that the ion beam typically has a diameter where it impinges on the wafer 14 which is much less than the area of the wafer as a whole. For example, the ion beam diameter may be from 2 to 5 cms, whereas the wafer diameter may be 20 cms or even 30 cms. It is standard practice in ion implanters to arrange for a relative scanning movement between the ion beam and the wafer to ensure an even distribution of implanted ions over the surface of the wafer. In the arrangement illustrated in FIG. 1, scanning in one orthogonal direction across the wafer is achieved by the scanning of the ion beam itself caused by the beam scanning device 12. To achieve the scanning of the beam relative to the wafer in the other orthogonal direction (in and out of the plane of the paper in the FIG. 1 example), the chuck 15 is mounted on an arm 16 which is in turn connected to an actuator 17 capable of translating the position of the arm 16 in a direction perpendicular to the plane of scanning of the ion beam.

The scanning arrangement can be better understood with reference to FIG. 2. The ion beam is represented schematically at 20 and it can be seen that the beam is scanned repeatedly to and fro in the direction of arrow 21. The wafer 14 on chuck 15 is at the same time scanned in the opposite orthogonal direction in the direction of arrow 22. The rate of scanning of the beam 20 may be much higher than the mechanical scanning rate of the chuck 15 and arm 16, so that the combination of beam scans in direction 21 and mechanical wafer scans in direction 22 produce a full raster like scan of the beam over the surface of the wafer. For a single implant process, the wafer may be mechanically scanned several times to and fro in the direction of arrow 22.

An example of a so called hybrid scanning system, using a combination of beam scanning and mechanical wafer scanning in implanters can be found in U.S. Pat. No. 5,229,615 and in WO 99/13488.

A slit Faraday arrangement 25 is located in the scanned ion beam 20 but to one side of the mechanically scanned position of the wafer chuck 15. The slit Faraday 25 includes an entrance slit 26 which allow beam ions to enter the Faraday Cup for detection. As the ion beam scans over the slit 26 on each beam scan, the integral of the charge captured by the Faraday Cup as the beam scans over the slit, is a value representing the total ionic current in the beam at that time. It will be understood that the Faraday Cup beam current detection arrangement can respond only to charged particles in the beam and does not respond to any particles of the desired species which may have been neutralised before reaching the Faraday Cup.

As is well known, ion generation in the ion source 10, transport of the ion beam through the mass selector 11 and the scanning device 12, and implantation itself, must all take place in a substantial vacuum and the required vacuum chamber is illustrated schematically in FIG. 1 by the dotted line 30. At least a process chamber 33 containing the wafer 14, chuck and scanning arm 16 is directly evacuated by a vacuum pump 31. Other parts of the apparatus may be directly evacuated by further vacuum pumps which are not shown in this drawing. In any case, the present invention depends on the appreciation that, in the absence of any residual gas generating sources within the process chamber, continuous operation of the vacuum pump 31 causes the residual gas pressure within the processing chamber to decline in accordance with a predictable curve having a definable pump down time constant.

The pressure in the process chamber 33 containing the wafer 14 is monitored by a pressure gauge 32. The pressure gauge 32 may take the form of a ion gauge or any other form of pressure gauge known for measuring very low pressures in vacuum systems. Importantly, for operation of the present invention, it is not important for the pressure gauge 32 to provide an accurate representation of the precise pressure at any time, but is required only to enable the way in which the pressure changes to be monitored, especially so that the pump down time coefficient can be determined.

The slit Faraday 25 and the pressure gauge 32 are connected to a dose controller 35.

The dose controller 35 uses values of the beam current from the slit Faraday 25 and data concerning the changes in the residual gas pressure derived from the pressure gauge 32 to estimate a corrected value for the beam current taking account of any neutralisation of beam ions which may have taken place in the beam before reaching the position of the Faraday and wafer 14.

The error in the beam current measured by the slit Faraday 25 is dependent on the number of beam ions which are neutralised before they reach the wafer. This in turn is known to be dependent on the residual gas pressure in the chamber through which the beam is travelling. During an implant, the wafer 14 being implanted will normally be partially coated with a resist so as to define those areas of the wafer surface in which ions are to be implanted. Ions impinging on resist coated surfaces are not implanted in the semiconductor wafer, but do have the effect of causing outgassing from the resist, which contributes to the residual gas pressure in the process chamber. Whilst the wafer is being mechanically scanned through the path of the ion beam, so that the ion beam is impinging upon resist coated surfaces of the wafer, outgassing from the resist coating tends to cause the residual gas pressure to rise. The rate of scanning of the beam by the scanning device 12 may be 100 Hz or higher and the dwell time of the beam at the end of each beam scan in the direction of arrow 21 when the beam is momentarily clear of the wafer, may be only fractions of a millisecond.

By comparison, when the wafer 14 on the chuck 15 is moved completely clear of the scanning beam by the mechanical scanning in the direction of the arrow 22, the wafer may be clear of the beam for a substantial fraction of a second. It can be considered, therefore, that the processing of the wafer proceeds with repeated scans, corresponding to the slow mechanical scan when the wafer is being translated in one direction of the arrow 22 completely through the plane of the scanned beam, separated by periods when the beam does not impinge on the wafer, that is when the wafer and scanning arm 16 is being turned around at the end of a mechanical scan above or below the plane of the beam. During these separating periods, the ion beam current can be measured by means of the slit Faraday 25 every time the beam is scanned over the slit Faraday at the beam scanning rate, 100 Hz or more. In practice, up to 20 or more time spaced beam current measurements can thus be taken during these separating periods when the wafer is completely clear of the scanned beam.

The dose controller 35 is arranged to accept these multiple values of the beam current from the slit Faraday 25 during each, or at least a plurality of, the above referred separating periods. Typically, the dose controller 35 forms part of an implant control system which also controls the actuator 17 of the scanning arm 16 over a control line 40. Accordingly, data indicating when the wafer is clear of the beam at the end of each mechanical sweep is available to dose controller 35, so that the separating periods can be determined.

The dose controller is also arranged to obtain a value for the pump down time constant of the chamber under the action of the vacuum pump 31. This is obtained using repeated measurements of gas pressure from the pressure gauge 32 during a period when no outgassing is taking place so that the pressure in the chamber should be reducing at an exponential rate.

Although the pump down time coefficient could be determined before the start of wafer processing, even during the initial pumping down of the chamber, it is preferable to measure the pump down time coefficient during each of the above referred separating periods, whenever a series of beam current readings are also being taken. Then the pump down time coefficient is always appropriate for the corresponding beam current measurements. It may be understood that the pump down time coefficient could vary during a process run, e.g. due to a change in the species in the residual gas to be evacuated, or other factors such as a change in the performance of the vacuum pump 31 or changes in temperature for example. Importantly, it is not essential for the pressure measurements from the pressure gauge 32 to be made at the same instants in time as the current measurements from the slit Faraday 25. However, it may be convenient to operate the dose controller to sample the pressure each time a new current reading is obtained.

Accordingly, the dose controller may operate to obtain as many as twenty beam current values at predetermined sample times during each of the separating periods at each end of the slow mechanical scan of the wafer through the plane of the scanned ion beam. At the same time, the dose controller obtains multiple values of pressure from the pressure gauge 32 and from these determines a value for the pump down time constant $\tau$. The multiple values and times of the beam current readings can then be used, in combination with the calculated value of $\tau$ to obtain a value for the factor $b_0$ in the equation (6) above. From this factor $b_0$ a value is obtained at each turnaround time of the mechanical wafer scan for the corrected beam current, allowing for neutrals which would not be counted by the slit Faraday, or ions which may have acquired an additional charge, which would appear as a double count in the Faraday.

It is well established in the art that it is important to obtain values for the true implant current, or the true rate at which desired species are being supplied to the wafer, during the course of an implant process, so as to modify the process to ensure that the desired dose of the species is delivered at the end of the process, and also to ensure that the dose is delivered uniformly over the surface of the wafer. Thus, the corrected value for beam current as obtained by the dose controller 25 as described above, may be used to change the mechanical scanning rate by the supply of control signals over the line 40 to the actuator 17. For example the rate of a mechanical scan of the wafer through the plane of the scanned beam could be increased if the dose controller detects that the true ion current has increased, thereby maintaining substantially the same dose delivery for the next mechanical scan together with appropriate uniformity over the wafer surface.

It should be understood that, instead of simply controlling the rate of mechanical scanning of the wafer through the beam, the dose controller may be arranged to adjust other parameters of the implanter, in response to the derived true values of beam current, in order to achieve the desired objective of dosage and uniformity. For example, the scanning device may be adjusted to speed up or reduce the scanning speed of the beam. It may also be possible directly to adjust the current in the beam, either by adjusting the ion source 10 or some intervening beam filtering device (not shown in FIG. 1).

In the above described embodiment, the implant machine is intended for implanting a single wafer at a time. To this end, wafer handling devices are provided in and adjacent to the process chamber containing the wafer during implantation, in order to remove wafers from the chuck 15 after processing and to deliver fresh wafers to the chuck for processing. Individual wafers are passed into and out of the process chamber via a loadlock mechanism. Such handling arrangements do not form part of the present invention and will not be described further.

It should be understood that embodiments of the invention may also be employed with batch type implant machines, particularly machines employing a rotating wheel carrying a number of wafers for simultaneous processing. In such machines the ion beam is usually fixed and the wafers are scanned across the beam in one direction by rotation of the wheel carrying the wafers about its periphery, and in a second direction by translation of the axis of the scanning wheel to and fro transversely of the beam direction. The present invention can have utility in such machines also. Repeated beam current measurements are then taken each time the slow scanning of the wafer (by translation of the axis of rotation of the scanning wheel) brings the wafers completely clear of the ion beam. During such separating periods, outgassing of resist from the wafer surfaces ceases and the residual gas pressure in the process chamber declines in accordance with the pump down time constant. Repeated ion beam currents taken during these periods can be used to calculate a value for the true or corrected ion beam current in accordance with the algorithms disclosed herein.

Other forms of relative scanning of the beam and wafer may also be contemplated. However in each case the invention requires periods during the wafer scanning when the beam resides completely off the wafer for long enough to take multiple beam current measurements.

What is claimed is:

1. An ion implanter having
   a vacuum chamber,
   a substrate holder in the vacuum chamber for supporting a target substrate,
   an ion beam generator for generating a beam of ions of a species to be implanted in the target substrate,
   a scanning apparatus for effecting a relative scanning movement of the ion beam across the target substrate,
   a vacuum pump for operating during implantation to pump residual gas from the vacuum chamber,
   a residual gas pressure detector producing a pressure signal indicative of changes in the residual gas pressure in the chamber,
   the scanning apparatus being arranged to produce during an implant repeated scans of the beam over the target substrate separated by periods when the beam does not impinge on the target substrate, whereby residual gas pressure in said chamber rises during each of said scans due to outgassing from the target substrate and falls during said separating periods due to pumping by said vacuum pump,
   an ion current detector providing multiple time spaced measurements of the ionic current in the ion beam at the target substrate during each of a plurality of the said separating periods, and
   a processor receiving said multiple measurements and data derived from said pressure signal indicating the changes in the residual gas pressure, and calculating therefrom a corrected value for total beam current representing the rate of delivery in the beam of particles of the species to be implanted.

2. An ion implanter according to claim 1, wherein the processor is arranged to calculate said corrected value by extrapolating changes in the measured ionic current during a said separating period to calculate a value for said current at infinite time.

3. An ion implanter according to claim 1, wherein during said separating periods residual gas pressure $P_t$ is related to time t by the expression $$P_t = P_0(\exp -t/\tau)$$

where $P_0$ is the pressure at t=0
and $\tau$ is the pump down time constant,
   and the processor is arranged to determine from said pressure signal a value for $\tau$, and to use said value of $\tau$ to estimate the shape of a curve fitting said multiple time spaced measurements of ionic current.

4. An ion implanter according to claim 1, wherein during said separating periods residual gas pressure $P_t$ is related to time t by the expression $$P_t = P_0(\exp -t/\tau)$$

where $P_0$ is the pressure at t=0
and $\tau$ is the pump down time constant,
   and the processor is arranged to calculate said corrected value by determining from said pressure signal a value for $\tau$ and calculating the true beam current ($I_0$) from the expression $$\ln I_i = b_0 + b_1 \left[\exp -\frac{t_i}{\tau}\right] + b_2 \left[\exp -\frac{t_i}{\tau}\right]^2$$

using multiple values of $I_i$ and $t_i$ to eliminate constants $b_1$ and $b_2$,
where $I_i$ is the measured ion beam current at time $t_i$ during a separating period, and $b_0 = \ln(I_0)$.

5. An ion implanter according to claim 1, wherein during said separating periods residual gas pressure $P_t$ is related to time t by the expression $$P_t = P_0(\exp -t/\tau)$$

where $P_0$ is the pressure at t=0
and $\tau$ is the pump down time constant, and
   the processor is arranged to determine from said pressure signal a value for $\tau$ during each said separating period.

6. An ion implanter according to claim 1 including a dose controller responsive to the corrected values for said total beam current calculated in respective separating periods during an implant to adjust the rate of delivery of particles of the required species to each unit area of the target substrate during subsequent scans to provide a desired total dose of said particles per unit area for the implant.

7. An ion implanter according to claim 6, wherein said scanning apparatus is responsive to said dose controller to adjust the speed of scanning of the target substrate relative to the ion beam to provide said adjustment of said rate of delivery.

8. An ion implanter according to claim 1, wherein the scanning apparatus comprises a scan wheel for carrying a batch of wafers for rotary scanning about a wheel axis and a scanning arm to move the wheel axis in a reciprocating motion, whereby said separating periods occur when the wheel axis is positioned so that the wafers of the batch carried on the rotating scan wheel do not pass through the beam.

9. An ion implanter according to claim 1, wherein the scanning apparatus comprises a wafer holder for holding a single wafer, a beam scanner to scan the ion beam across the wafer in one direction and a scanning arm carrying the wafer holder for reciprocating movement through the plane of the scanned beam, whereby said separating periods occur when said scanning arm is positioned to hold a wafer on the wafer holder clear of the scanned beam.

10. A method of implanting a selected species of ion into a target substrate, the method comprising supporting the target substrate on a holder in a vacuum chamber, creating a vacuum within the vacuum chamber generating a beam of ions of the selected species to be implanted, pumping residual gas from the vacuum chamber during implantation of the ions into the substrate, effecting a repeated relative scanning movement of the ion beam across the target substrate, with repeated relative scanning movements of the beam over the target substrate being separated by periods when the beam does not impinge on the target substrate, whereby residual gas pressure in said vacuum chamber rises during each of said scans due to outgassing from the target substrate and falls during said separating periods due to said pumping, producing a pressure signal indicative of changes in the residual pressure in the chamber, effecting multiple time spaced measurements of the ionic current in the ion beam at the target substrate during each of a plurality of said separating periods, and calculating, from said multiple measurements and data derived from said pressure signal indicating the changes in the residual gas pressure, a corrected value for total beam current representing the rate of delivery in the beam of particles of the species to be implanted.

11. Apparatus of implanting a selected species of ion into a target substrate, comprising means for supporting the target substrate on a holder in a vacuum chamber, means for creating a vacuum within the vacuum chamber means for generating a beam of ions of the selected species to be implanted, means for pumping residual gas from the vacuum chamber during implantation of the ions into the substrate, means for effecting a repeated relative scanning movement of the ion beam across the target substrate, with repeated relative scanning movements of the beam over the target substrate being separated by periods when the beam does not impinge on the target substrate, whereby residual gas pressure in said vacuum chamber rises during each of said scans due to outgassing from the target substrate and falls during said separating periods due to said pumping, means for producing a pressure signal indicative of changes in the residual pressure in the chamber, means for effecting multiple time spaced measurements of the ionic current in the ion beam at the target substrate during each of a plurality of said separating periods, and means for calculating, from said multiple measurements and data derived from said pressure signal indicating the changes in the residual gas pressure, a corrected value for total beam current representing the rate of delivery in the beam of particles of the species to be implanted.

12. Dose monitoring apparatus for an ion implanter of the type comprising a vacuum chamber, a substrate holder in the vacuum chamber for supporting a target substrate, an ion beam generator for generating a beam of ions of a species to be implanted in the target substrate, a scanning apparatus for effecting a relative scanning movement of the ion beam across the target substrate, a vacuum pump for operating during implantation to pump residual gas from the vacuum chamber, a residual gas pressure detector producing a pressure signal indicative of changes in the residual gas pressure in the chamber, the scanning apparatus being arranged to produce during an implant repeated scans of the beam over the target substrate separated by periods when the beam does not impinge on the target substrate, whereby residual gas pressure in said chamber rises during each of said scans due to outgassing from the target substrate and falls during said separating periods due to pumping by said vacuum pump, and an ion current detector capable of providing multiple time spaced indications of the ionic current in the ion beam at the target substrate during each of a plurality of the said separating periods, the dose monitoring apparatus comprising a processor arranged to receive said pressure signal and said ionic current indications, to determine ionic current measurement values from said indications, to record the determined measurement values and the timing of the respective measurements during each of said plurality of said separating periods, and to calculate from said recorded values in each said separating period, together with data derived from said pressure signal, a respective corrected value for the total beam current representing the rate of delivery in the beam of particles of the species to be implanted.

13. Dose monitoring apparatus as claimed in claim 1, wherein the processor is arranged to calculate from the received pressure signal a value for the pump down time constant $\tau$ during said separating periods, and to use the pump down time constant $\tau$ in calculating said respective corrected beam current values.

14. Dose monitoring apparatus as claimed in claim 13, wherein the processor records multiple time spaced relative pressure values from said pressure signal during a said separating period and calculates therefrom a value for said pump down time constant $\tau$.

15. A computer readable storage medium carrying instructions for controlling dose monitoring apparatus for an ion implanter of the type comprising a vacuum chamber, a substrate holder in the vacuum chamber for supporting a target substrate, an ion beam generator for generating a beam of ions of a species to be implanted in the target substrate, a scanning apparatus for effecting a relative scanning movement of the ion beam across the target substrate, a vacuum pump for operating during implantation to pump residual gas from the vacuum chamber, a residual gas pressure detector producing a pressure signal indicative of changes in the residual gas pressure in the chamber, the scanning apparatus being arranged to produce during an implant repeated scans of the beam over the target substrate separated by periods when the beam does not impinge on the target substrate, whereby residual gas pressure in said chamber rises during each of said scans due to outgassing from the target substrate and falls during said separating periods due to pumping by said vacuum pump, and an ion current detector capable of providing multiple time spaced indications of the ionic current in the ion beam at the target substrate during each of a plurality of the said separating periods, the dose monitoring apparatus including computer processing apparatus having a reader for reading the instructions on the storage medium, wherein said instructions are effective to control said computer processing apparatus of said dose monitoring apparatus to receive said pressure signal and said ionic current indications, to determine ionic current measurement values from said indications, to record the determined measurement values and the timing of the respective measurements during each of said plurality of said separating periods, and to calculate from said recorded values in each said separating period, together with data derived from said pressure signal, a respective corrected value for the total beam current representing the rate of delivery in the beam of particles of the species to be implanted.

16. A computer readable storage medium as claimed in claim 15, wherein said instructions are further effective to control said computer processing apparatus to calculate from the received pressure signal a value for the pump down time constant $\tau$ during said separating periods, and to use the pump down time constant $\tau$ in calculating said respective corrected beam current values.

17. A computer readable storage medium as claimed in claim 16, wherein said instructions are further effective to control said computer processing apparatus to record multiple time spaced relative pressure values from said pressure signal during a said separating period and to calculate therefrom a value for said pump down time constant $\tau$.

* * * * *